United States Patent [19]

Palmer

[11] Patent Number: 4,576,697
[45] Date of Patent: Mar. 18, 1986

[54] SYNTHESIS OF CARBON-CONTAINING INTERCALATABLE LAYERED TRANSITION METAL CHALOCOGENIDES

[75] Inventor: David N. Palmer, Tolland, Conn.

[73] Assignee: Combustion Engineering, Inc., Windsor, Conn.

[21] Appl. No.: 487,148

[22] Filed: Apr. 21, 1983

[51] Int. Cl.$^4$ .............................................. C23C 15/00
[52] U.S. Cl. ............................ 204/192 N; 204/192 C; 204/298; 423/414; 423/456; 429/194; 429/218
[58] Field of Search ...................... 429/218; 204/192 C, 204/192 N, 298; 429/194; 250/429.3

[56] References Cited

U.S. PATENT DOCUMENTS

| | | | |
|---|---|---|---|
| 3,806,380 | 4/1974 | Kitada et al. | 204/192 N |
| 4,089,990 | 5/1978 | Walker | 204/192 C |
| 4,278,890 | 7/1981 | Gruen et al. | 204/298 |
| 4,281,029 | 7/1981 | Takagi | 204/192 N |
| 4,281,030 | 7/1981 | Silfast | 204/192 N |
| 4,299,892 | 11/1981 | Dines | 429/218 |
| 4,366,215 | 12/1982 | Coetzer | 429/218 |
| 4,390,604 | 6/1983 | Evans et al. | 429/218 |
| 4,395,467 | 7/1983 | Vossen et al. | 428/697 |
| 4,404,233 | 9/1983 | Ikeda et al. | 204/192 N |
| 4,440,108 | 4/1984 | Little et al. | 204/298 |

OTHER PUBLICATIONS

Brec et al. Inorg. Chem. 16 (1977), pp. 660–665.
Beckmann et al. Monat. Fur Chem. 101 (1970), pp. 945–955.
Alberts et al. Chem. Abst. 98 (1983) #112023.
Sartwell et al. Chem. Abst. 93 (1980) #171740.
Belyi et al. Chem. Abst. 90 (1979) #172838.
Kirk-Othmer Encyclopedia of Chemical Technology, vol. 13, 1981 (John Wiley & Sons) New York, N.Y., pp. 706–719.
Murphy et al., "Vanadium Disulfide: Metal Substitution and Lithium Intercalation", *J. of Solid State Chemistry*, 29, 339–343 (1979).
Whittingham, "Chemistry of Intercalation Compounds: Metal Guests in Chalcogenide Hosts", *Prog. Solid State Chem.*, vol. 12, pp. 4–99 (1978).

*Primary Examiner*—Arthur P. Demers
*Attorney, Agent, or Firm*—Brumbaugh, Graves, Donohue & Raymond

[57] ABSTRACT

Carbon-containing intercalatable layered or lamellar transition metal chalcogenides having the general formula $M_nX_2C$ where M is a transition metal selected from the group consisting of Ti, V, Cr, Fe, Zr and Ta; X is sulfur; and n is 1-2; such as $TiS_2C$ or $Ti_2S_2C$, usable as cathode active materials in alkali metal nonaqueous secondary batteries that can undergo alkali metal intercalation, are synthesized by ion implanting a substrate of the transition metal with sulfur and then carbon at implantation energies in the range of about 150–200 kiloelectron volts and at saturation dosages of $1\times10^{12}$ to $1\times10^{19}$ sulfur and carbon atoms/cm$^2$.

4 Claims, No Drawings

SYNTHESIS OF CARBON-CONTAINING INTERCALATABLE LAYERED TRANSITION METAL CHALOCOGENIDES

The present invention relates to the synthesis of carbon-containing intercalatable layered or lamellar transition metal chalcogenides.

Layered or lamellar transition metal chalcogenides are well known to be useful as the cathode active material for alkali metal nonaqueous secondary batteries which operate upon the principle of intercalation. Typical examples of such materials and such batteries are those disclosed, for example, in U.S. Pat. Nos. 4,009,052; 4,049,879; 4,049,887; 4,198,476; 4,206,276; 4,207,245; 4,228,226; and 4,233,377.

The object of the present invention is to provide alternative cathode active materials having improved or greater conductivity and improved or reduced cell internal resistance and a process for their preparation.

In accordance with the present invention there is provided a process for the synthesis of carbon-containing intercalatable layered transition metal chalcogenides which comprises:

(a) forming a compound having the general formula $M_nX_2C$ where M is a transition metal selected from the group consisting of Ti, V, Cr, Fe, Zr and Ta; X is sulfur; and n is 1–2; by the steps of:

(a$_1$) ion implanting sulfur at an implantation energy in the range of about 150–200 kiloelectron volts and at a saturation dosage of $1\times10^{12}$ to $1\times10^{19}$ sulfur atoms/cm$^2$ into a substrate of the transition metal; and (a$_2$) then ion implanting carbon at an implantation energy in the range of about 150–200 kilo electron volts and at a saturation dosage of $1\times10^{12}$ to $1\times10^{19}$ carbon atoms/cm$^2$ into the sulfur-implanted substrate of the transition metal.

In a preferred embodiment of the process of the present invention, the ion-implanted substrate of the transition metal is annealed under a vacuum of from about $1\times10^{-4}$ torr to about $1\times10^{-6}$ torr at a temperature of from about 200° C. to about 500° C. for about 24 hours to about 48 hours. The annealing can be performed after each ion-implanting step or at the end of the ion-implanting steps.

The transition metals usable in the process of the present invention, as noted above, are titanium, vanadium, chromium, iron, zirconium and tantalum. The preferred transition metal is titanium.

The substrate of the transition metal can be, for example, a foam or a thin film, e.g., 1–10 μm thickness.

The chalcogen usable in the process of the present invention, as also noted above, is sulfur.

Ion implantation in the process of the present invention can be achieved by using a conventional ion implantation apparatus wherein a source of the sulfur or carbon to be implanted is first ionized and then accelerated in an electric field to implantation energies which usually lie in the range of about 150–200 kiloelectron volts (keV) in a moderately hard vacuum (r 1 m Pa). Prior to impact on the transition metal substrate target, a particular ion species is discriminated by a magnetic field accelermeter.

The ion-implanted compounds MX$_2$C or M$_2$X$_2$C, such as TiS$_2$C or Ti$_2$S$_2$C, of the present invention can be used as cathode active materials in alkali metal nonaqueous secondary batteries that can undergo alkali metal intercalation. They have improved or greater conductivity than transition metal chalcogenides due to their carbon content. The substrate of the transition metal can serve as the current collector when the transition metal is a conductive metal. The products also have reduced cell internal resistance due to their carbon content, e.g., 0.09 ohms for a Ti$_2$S$_2$C cathode versus 0.3 ohms for a TiS$_2$ cathode in comparable secondary cells.

The products of the present invention are not only useful as cathode active materials for nonaqueous intercalatable secondary batteries, but are also useful as catalysts and as photoactive materials. They can also be employed in the production of fuel cells, photogalvanic devices and photovoltaic devices.

The processes and products of the present invention will be further illustrated by the following representative examples thereof.

EXAMPLES

Pretreatment for all Foam Substrates

Specimens of Ti, V, Cr, Fe, Zr and Ta foams were ultrasonically cleaned in a detergent/water mixture at 25° C. followed by a rinse and soak in acetone and cyclohexane. After solvent soak the specimens were vacuum dried at $1\times10^{-4}$ torr for 2 hours at 25° C.

Specimens of foams with the exception of those transition metals which hydride readily (e.g. Zr) were placed in a quartz reactor and evacuated to $1\times10^{-6}$ torr for 30 minutes. At the $1\times10^{-6}$ torr condition the reactor containing the foam was back filled with 90% He and 10% H$_2$ to 1 atmosphere. The reactor was sealed to the environment and heated at a rate of 10° C./minute to 500° C. The specimens were held isothermally for 24 hours at 500° C. and then slowly allowed to cool to 25° C. The foams were removed from the quartz reactor in a controlled argon environment.

Ion Implantation of Foam Substrates

Depth dose studies were completed to find appropriate doses and energies for saturation range and straggling values were calculated and sputter yields were found for chalcogen (sulfur) implanted. All foam specimens were placed in a specially designed holder to continuously cool the specimen during implantation. If the foams are not properly cooled, melting or degradation of the foam structure can occur. Prior to implanation it was found that inert gas sputtering of the surface was not necessary, because >800 Å of the foam fibril surfaces were removed by the impinging chalcogen (sulfur) ion stream prior to actual implant.

Chalcogen (sulfur) implanting was completed before carbon implantation. Dosages and implantation energy and depth are listed in Table 1 below.

TABLE 1

ION IMPLANTATION: Doses, Energy and Depth
Sulfur Beam Current = 1.2 mA
Carbon Beam Current = 1.1 mA

| Transition Metal | Dosage for Indicated Ions (ions/cm$^2$ × 10$^{18}$) | | Energy (KeV) | | Depth (Å) |
| --- | --- | --- | --- | --- | --- |
| | S | C | S | C | S |
| Ti | 2.5 | 0.9/2.0 | 200 | 150 | ~2200 |
| V | 2.5 | 0.9/2.0 | 200 | 150 | ~1750 |
| Cr | 2.4 | 0.9/2.0 | 200 | 150 | ~1400 |
| Fe | 2.4 | 0.9/2.0 | 200 | 150 | ~1400 |
| Zr | 1.2 | 0.9/2.0 | 150 | 150 | ~1400 |
| Ta | 1.1 | 0.9/2.0 | 200 | 150 | ~1000 |

The surfaces implanted with chalcogen (sulfur) were examined by scanning electron microscope (SEM) and by x-ray fluorescence analysis. X-ray analysis verified the following atom ratios on the implanted surfaces set forth in Table 2 below confirming atomic ratio values.

Table 2

Chalcogen (Sulfur) to Transition Metal Atom Ratio

S/Ti = 2.0:1.0 ($TiS_{2.0}$)
S/V = 2.0:1.0 ($VS_{2.0}$)
S/Cr = 1.9:1.0 ($CrS_{1.9}$)
S/Fe = 2.0:1.0 ($FeS_{2.0}$)
S/Zr = 2.0:1.0 ($ZrS_{2.0}$)
S/Ta = 1.6:1.0 ($TaS_{1.6}$)

Specimen weights of the foams prior to implantation are given in Table 3 below.

Table 3

Specimen Weights (grams) of Foam Prior to Implantation (0.75" × 0.75" on edge by 0.25" thick)

Ti = 0.3513
V = 0.3735
Cr = 0.3814
Fe = 0.4096
Zr = 0.4795
Ta = 1.3271

As noted above, after implantation with the chalcogen (sulfur) carbon was implanted at $0.9 \times 10^{18}$ atoms/cm² and at $2.0 \times 10^{18}$ atoms/cm² at 150 KeV in all cases. Carbon analysis revealed the following data in Table 4 below.

TABLE 4

| Carbon/Chalcogen (Sulfur)/Transition Metal Atom Ratio | | |
|---|---|---|
| | Specimen #1 $0.9 \times 10^{18}$ atoms/cm² | Specimen #2 $2.0 \times 10^{18}$ atoms/cm² |
| C/S/Ti = | 1.0:2.0:1.0($TiS_2C$) | 1.0:2.0:2.0 ($Ti_2S_2C$ or $TiS_2 \cdot TiC$) |
| C/S/V = | 1.0:2.0:1.0($VS_2C$) | 1.0:2.0:2.0 ($V_2S_2C$ or $VS_2 \cdot VC$) |
| C/S/Cr = | 1.0:1.9:1.0($CrS_{1.9}C$) | 1.0:2.0:2.0 ($Cr_2S_2C$ or $CrS_2 \cdot CrC$) |
| C/S/Fe = | 1.0:2.0:1.0($FeS_2C$) | 1.0:2.0:2.0 ($Fe_2S_2C$ or $FeS_2 \cdot FeC$) |
| C/S/Zr = | 1.0:2.0:1.0($ZrS_2C$) | — |
| C/S/Ta = | — | 1.0:2.0:2.0 ($Ta_2S_2C$ or $TaS_2 \cdot TaC$) |

All S as well as S+C implanted foams were annealed at $1 \times 10^{-6}$ torr for 32 hours at 300° C.

After implantation with S+C a $Ti_2S_2C[(Ti+S)+C]$ foam was configured in a standard electrochemical cell configuration and tested for secondary battery characteristics. The conditions for the cell evaluations and cell results are listed in Table 5 below.

TABLE 5

Electrochemical Secondary Cell Characteristics of $Ti_2S_2C[(Ti + S) + C]$ Implanted Specimens Conditions and Figures of Merit Cathode: $Ti_2S_2C[(Ti + S) + C]$ implanted
Anode: Li metal
Electrolyte and Solvent: 2.17 M $LiAsF_6$ + (70 v/° Dioxolane + 30 v/° dimethoxyethane)
Implant Depth: ~2200Å
Geometric Surface Area: 0.75 m² (3.63 cm²)
$Ti_2S_2C$ Surface Volume: $4.84 \times 10^{-8}$ cm³

TABLE 5-continued

Electrochemical Secondary Cell Characteristics of $Ti_2S_2C[(Ti + S) + C]$ Implanted Specimens Discharge Current: 0.01 mA;
Current Density: $2.8 \times 10^{-3}$ mA/cm²
Charge Current: 0.005 mA; Current Density: $1.4 \times 10^{-3}$ mA/cm²
Volumetric Current Density: Discharge - $2.07 \times 10^5$ mA/cm³
Charge - $1.03 \times 10^5$ mA/cm³
Voltage Limits: 3.0 –1.6 V
Open Circuit Voltage: = 2.82 V
Internal Resistance: = 0.09 ohms
1st Cycle Energy Density: 279 whr/kg
Published Energy Density: = 480 whr/kg as $TiS_2$ only
Theoretical Energy Density
(as $TiS_2$ + TiC) = 488 whr/kg at 2.16 V
(as $Ti_2S_2C$) = 281 whr/kg at 1.8 V
Midrange Voltage: 1.79 V
% Total Fade (1st → 2nd cycle) (Based on $t_D$) = 46.82%
% Energy Density Fade/Cycle (3rd Cycle Reference) (%/Cycle)
at 4th cycle = 0.00
at 8th cycle = 0.00
at 12th cycle = 0.09
at 28th cycle = 0.02
at 32nd cycle = 0.00

(A) Cyclic Cell Test Data

| Cycle No. | Discharge Time $t_D$ (seconds) | Charge Time $t_C$ (seconds) |
|---|---|---|
| 1 | 801 | 507 |
| 2 | 426 | 1105 |
| 3 | 400 | 850 |
| 4 | 390 | 812 |
| 5 | 395 | 806 |
| 6 | 330 | 842 |
| 7 | 401 | 841 |
| 8 | 412 | 860 |
| 9 | 395 | 810 |
| 10 | 400 | 850 |
| 15 | 390 | 830 |
| 20 | 382 | 840 |
| 25 | 383 | 835 |
| 30 | 400 | 855 |
| 35 | 376 | 835 |

(B) % Energy Density Fade/Cycle (Referenced to Cycle No. 3)

| Cycle No. | $t_D$ Energy Fade/Cycle |
|---|---|
| 4 | 0.00 |
| 8 | 0.00 |
| 12 | 0.09 |
| 16 | 0.12 |
| 20 | 0.23 |
| 24 | 0.33 |
| 28 | 0.02 |
| 32 | 0.00 |
| 35 | 0.18 |

Average % Fade/Cycle (4 → 35) = 0.03%

Data contained in Table 5 above indicate the following:

Based on the energy density data shown in Table 5, ion implanted $TiS_2$ followed by a further carbon implant yielded a compound equivalent to $Ti_2S_2C$ and not $TiS_2$+TiC. The $Ti_2S_2C$ specimen displayed adequate secondary cell characteristics.

What is claimed is:

1. A process for treating the surface of a transition metal substrate to form into the surface a carbon-containing intercalatable layered transition metal chalcogenide having the general formula $M_nX_2C$ where M is a transition metal selected from the group consisting of Ti, V, Cr, Fe, Zr and Ta; X is sulfur; and n is 1-2; which comprises:

ion implanting sulfur at an implantation energy in the range of about 150-200 kiloelectron volts and at a saturation dosage of about $10^{18}$ sulfur atoms/cm² into the surface of the transition metal substrate to a depth of about 1000-2200 Å; and then ion implanting carbon at an implantation energy in the range of about 150-200 kiloelectron volts and at a saturation dosage of about $10^{18}$ carbon atoms/cm$^2$ into the surface of the sulfur-implanted transition metal substrate to a depth of about 1000-2200 Å.

2. A process according to claim 1 wherein M is Ti, X is S and n is 1.

3. A process according to claim 1 wherein M is Ti, X is S and n is 2.

4. A process according to claim 1 wherein the ion-implanted transition metal substrate is annealed under a vacuum of from about $1 \times 10^{-4}$ torr to about $1 \times 10^{-6}$ torr at a temperature of from about 200° C. to about 500° C. for from about 24 hours to about 48 hours.

* * * * *

UNITED STATES PATENT AND TRADEMARK OFFICE
CERTIFICATE OF CORRECTION

PATENT NO. : 4,576,697

DATED : March 18, 1986

INVENTOR(S) : David N. Palmer

It is certified that error appears in the above-identified patent and that said Letters Patent is hereby corrected as shown below:

First page, third line of Item 54; col. 1, line 3; "CHALOCOGENIDES" should read -- CHALCOGENIDES --.
Col. 2, lines 45-46, "implanation" should read -- implantation --.

Signed and Sealed this

Twenty-second Day of July 1986

[SEAL]

Attest:

DONALD J. QUIGG

Attesting Officer

Commissioner of Patents and Trademarks